United States Patent
Chen et al.

(10) Patent No.: US 12,038,687 B2
(45) Date of Patent: Jul. 16, 2024

(54) METHOD FOR BUILDING AN ETCHING-FREE HYBRID NONLINEAR WAVEGUIDE COMPOSED OF POLYMER AND ION-IMPLANTED NONLINEAR CRYSTAL

(71) Applicant: SHANDONG NORMAL UNIVERSITY, Jinan (CN)

(72) Inventors: Chen Chen, Jinan (CN); Zhanghua Han, Jinan (CN); Shengkun Yao, Jinan (CN); Feng Chen, Jinan (CN)

(73) Assignee: SHANDONG NORMAL UNIVERSITY, Jinan (CN)

( * ) Notice: Subject to any disclaimer, the term of this patent is extended or adjusted under 35 U.S.C. 154(b) by 0 days.

(21) Appl. No.: 18/503,908

(22) Filed: Nov. 7, 2023

(65) Prior Publication Data
US 2024/0069436 A1 Feb. 29, 2024

(51) Int. Cl.
| | |
|---|---|
| *G03F 7/00* | (2006.01) |
| *G02F 1/377* | (2006.01) |
| *G03F 7/16* | (2006.01) |
| *G03F 7/40* | (2006.01) |
| *G03F 7/038* | (2006.01) |
| *G03F 7/039* | (2006.01) |

(52) U.S. Cl.
CPC .......... *G03F 7/0007* (2013.01); *G02F 1/377* (2013.01); *G03F 7/162* (2013.01); *G03F 7/40* (2013.01); *G03F 7/038* (2013.01); *G03F 7/039* (2013.01)

(58) Field of Classification Search
CPC .......... G03F 7/0007; G03F 7/162; G03F 7/40; G03F 7/30; G03F 7/70383; G02F 1/377; G02B 6/13; G02B 6/1347
See application file for complete search history.

(56) References Cited

U.S. PATENT DOCUMENTS

| | | | | |
|---|---|---|---|---|
| 4,061,799 A | * | 12/1977 | Brewer | ........... G03F 7/038 430/323 |
| 6,319,430 B1 | * | 11/2001 | Bordui | ........... C30B 29/30 423/598 |

(Continued)

FOREIGN PATENT DOCUMENTS

| | | | |
|---|---|---|---|
| CN | 1438500 A | * | 8/2003 |
| CN | 1438500 A | | 8/2003 |

(Continued)

OTHER PUBLICATIONS

"Soft lithography: SU-8 coating", Elveflow https://www.elveflow.com/microfluidic-reviews/soft-lithography-microfabrication/soft-lithography-su-8-coating/ Published Apr. 11, 2013 (Year: 2013).*

(Continued)

*Primary Examiner* — Sean M DeGuire
*Assistant Examiner* — Alexander N. Lee

(57) ABSTRACT

A method for building an etching-free hybrid nonlinear waveguide composed of a polymer and an ion-implanted nonlinear crystal is provided. A nonlinear crystal is pre-treated, and subjected to ion implantation to obtain an ion-implanted nonlinear crystal. The ion-implanted nonlinear crystal is spin-coated with a photoresist, and subjected to electron beam exposure, heating, and developing, so as to obtain a hybrid optical waveguide composed of a polymer and a nonlinear crystal.

1 Claim, 11 Drawing Sheets

(56) References Cited

U.S. PATENT DOCUMENTS

| | | | | |
|---|---|---|---|---|
| 2003/0022515 A1* | 1/2003 | Nakagawa | ............ | H01L 21/312 |
| | | | | 427/337 |
| 2003/0059190 A1 | 3/2003 | Gunn | | |
| 2006/0128923 A1* | 6/2006 | Roesler | ................ | C08G 18/673 |
| | | | | 528/44 |
| 2007/0269749 A1* | 11/2007 | Schenker | .................. | G03F 7/30 |
| | | | | 257/E21.027 |

FOREIGN PATENT DOCUMENTS

| | | | | |
|---|---|---|---|---|
| CN | 101943768 A | * | 1/2011 | |
| CN | 101943768 A | | 1/2011 | |
| CN | 101950047 A | * | 1/2011 | |
| CN | 109975926 A | | 7/2019 | |
| CN | 113933935 A | | 1/2022 | |

OTHER PUBLICATIONS

"Soft lithography: SU-8 baking", Elveflow Published Feb. 13, 2020 https://www.elveflow.com/microfluidic-reviews/soft-lithography-microfabrication/soft-lithography-su-8-baking/ (Year: 2020).*

Yiwen Wang, "Strip-loaded Waveguides and Integrated Optical Devices on Single-Crystal Lithium Niobate Thin Films", Chinese doctoral dissertation full text database Basic Science series, No. 9, Sep. 2019, pp. 18-66.

* cited by examiner

METHOD FOR BUILDING AN ETCHING-FREE HYBRID NONLINEAR WAVEGUIDE COMPOSED OF POLYMER AND ION-IMPLANTED NONLINEAR CRYSTAL

CROSS-REFERENCE TO RELATED APPLICATIONS

This application claims the benefit of priority from Chinese Patent Application No. 202211397516.5, filed on Nov. 9, 2022. The content of the aforementioned application, including any intervening amendments made thereto, is incorporated herein by reference in its entirety.

TECHNICAL FIELD

This application relates to ion beam material modification, micro-nano processing, integrated optics and nonlinear optics, and more particularly to a method for building an etching-free hybrid nonlinear waveguide composed of a polymer and an ion-implanted nonlinear crystal.

BACKGROUND

Optical waveguide is a basic unit of integrated optics, which can confine beams within a core region and guide the directional beam propagation. The optical limitation and confinement of the optical waveguide are usually based on total reflection, which requires a refractive index of the core region of the waveguide to be greater than that of a surrounding region.

Nonlinear crystals are a special type of optical crystals, and the light will experience a frequency change when passing through the nonlinear crystals due to the nonlinear polarization response. By utilizing one or more of the nonlinear effects such as sum frequency, difference frequency, frequency multiplication, parametric oscillation, and parametric down-conversion, the light frequency can be artificially controlled to generate new optical signals or entangled photon pairs with ideal frequencies.

Nonlinear optical waveguides combine advantages of the optical waveguides and the nonlinear crystals, which can simultaneously realize optical limitation and confinement, guidance of optical transmission and change of optical frequency. This is of great significance to the development of integrated optics and nonlinear optics.

However, it has been proved that nonlinear crystals are often difficult to be processed into the optical waveguides, especially difficult to be etched. Specifically, an etching rate of the nonlinear crystals is extremely low, which is usually less than 1% of an etching rate of silicon-based materials. Moreover, after etching, the quality of the nonlinear crystal waveguides is unsatisfactory, and its surface roughness is generally several orders of magnitude higher than that of the silicon-based materials. The former means huge consumption of time and raw materials, and the latter will seriously affect the transmission and nonlinear frequency conversion performances of nonlinear waveguides.

The above problems can be partially solved when using a precision machine for cutting and polishing, and the machined nonlinear waveguides often have relatively smooth sidewalls. However, the mechanical processing is only suitable for the fabrication of straight strip-shaped waveguides, and often fails to be applied to the fabrication of curved, ring-shaped and arrayed integrated waveguides and those with complex two-dimensional cross-sections.

Therefore, a method for building an etching-free hybrid nonlinear waveguide composed of a polymer and an ion-implanted nonlinear crystal is proposed, which does not require etching or mechanical processing of the nonlinear crystals, and only requires conventional exposure, development and other operations on photoresists spin-coated on crystal surfaces. Based on the special physical mechanism of bound state in the continuum (BIC), the beams are limited within a specific area in a nonlinear crystal waveguide layer, achieving a nonlinear process with low transmission loss and high conversion efficiency.

SUMMARY

An object of the disclosure is to provide a method for building an etching-free hybrid nonlinear waveguide composed of a polymer and an ion-implanted nonlinear crystal based on the bound state mechanism in the continuum (BIC) to overcome the problems in the prior art that there is large difficulty in etching nonlinear crystal optical waveguides, and the mechanical processing can only produce a single structure.

Technical solutions of the present disclosure are described as follows.

This application provides a method for building an etching-free hybrid nonlinear waveguide composed of a polymer and an ion-implanted nonlinear crystal, comprising:

(1) pretreating a nonlinear crystal to obtain a nonlinear wafer, and subjecting the nonlinear wafer to ion implantation to obtain an ion-implanted nonlinear wafer;

(2) spin-coating a photoresist on the ion-implanted nonlinear wafer followed by electron beam exposure and heating to obtain a polymer-coated nonlinear wafer; and (3) developing the polymer-coated nonlinear wafer to obtain the etching-free hybrid optical waveguide.

In some embodiments, the step of pretreating the nonlinear crystal comprises:

cutting the nonlinear crystal to obtain the nonlinear wafer, performing surface treatment on the nonlinear wafer, and storing the nonlinear wafer in a storage device for use.

In some embodiments, the ion implantation is performed by using an ion accelerator; and an acceleration energy of the ion accelerator is set such that the nonlinear wafer is bombarded to form an isolation layer and a waveguide layer.

In some embodiments, the step of spin-coating the photoresist on the ion-implanted nonlinear wafer comprises:

placing the ion-implanted nonlinear wafer in a heating furnace to remove moisture in the nonlinear wafer, naturally cooling the ion-implanted nonlinear wafer to room temperature, and spin-coating the photoresist on the ion-implanted nonlinear wafer to obtain a photoresist-coated nonlinear wafer.

In some embodiments, the step of spin-coating the photoresist on the ion-implanted nonlinear wafer comprises:

dropwise adding the photoresist onto a surface of the ion-implanted nonlinear wafer, and transferring the ion-implanted nonlinear wafer to a spin coater for spin coating to obtain the photoresist-coated nonlinear wafer.

In some embodiments, the method further comprises:

before the electron beam exposure, heating the photoresist-coated nonlinear wafer to cure the photoresist.

In some embodiments, the electron beam exposure is performed through steps of:

drawing a two-dimensional pattern of an exposure area and introducing the two-dimensional pattern into an electron beam lithography system, and irradiating the photoresist based on the two-dimensional pattern to induce a chemical reaction in the photoresist, so as to obtain an exposed nonlinear wafer.

In some embodiments, in step (2), the heating is performed to allow the photoresist on the exposed nonlinear wafer to undergo polymerization to form the polymer insoluble in a developing solution, so as to obtain the polymer-coated nonlinear wafer; and the method further comprises:

cooling the polymer-coated nonlinear wafer before developing the polymer-coated nonlinear wafer.

In some embodiments, the step of developing the polymer-coated nonlinear wafer comprises:

soaking the polymer-coated nonlinear wafer in the developing solution followed by rinsing with isopropyl alcohol to remove remaining unpolymerized photoresist and developing solution, so as to obtain the etching-free hybrid optical waveguide.

Compared to the prior art, this application has the following beneficial effects.

The fabrication method of the disclosure does not require direct alteration of geometric characteristics of the nonlinear crystal waveguide layer, thereby avoiding difficulties and challenges of etching the nonlinear crystal, and overcoming the shortcoming that the mechanical processing can only produce a single waveguide structure from the nonlinear crystal.

Theoretically, exposure and development of the SU-8 photoresist can achieve the construction of any two-dimensional stretched pattern. Therefore, this application can prepare a variety of waveguide structures, such as linear, curved, annular waveguides, waveguide arrays, etc., as well as a combination thereof, and can even realize the fabrication of waveguides for photonic integrated circuits (PICs), which has a promising application prospect.

In addition, thicknesses of the crystal waveguide layer and the photoresist can be freely adjusted within a certain range. Therefore, the method provided by the disclosure has high flexibility, strong scalability, simple process, convenient operation, and less time and material consumption.

BRIEF DESCRIPTION OF THE DRAWINGS

In order to more clearly illustrate the technical solutions in the embodiments of the present disclosure or in the prior art, the drawings needed in the description of embodiments will be briefly introduced below. Obviously, presented in the drawings are only some embodiments of the present disclosure, which are not intended to limit the disclosure. For those of ordinary skill in the art, other drawings can be obtained based on these drawings without exerting creative efforts.

DETAILED DESCRIPTION OF EMBODIMENTS

This application will be clearly and completely described below with reference to the accompanying drawings in the embodiments of the disclosure. Obviously, the described embodiments are merely some of the embodiments of the disclosure, but not all of the embodiments. Based on the embodiments of the disclosure, all other embodiments obtained by those of ordinary skill in the art without creative efforts shall fall within the scope of the disclosure defined by the appended claims.

In order to make the above objects, features and advantages of the disclosure more obvious and understandable, this application will be described in further detail below with reference to the accompanying drawings and specific embodiments.

Embodiment 1

Figure 1:
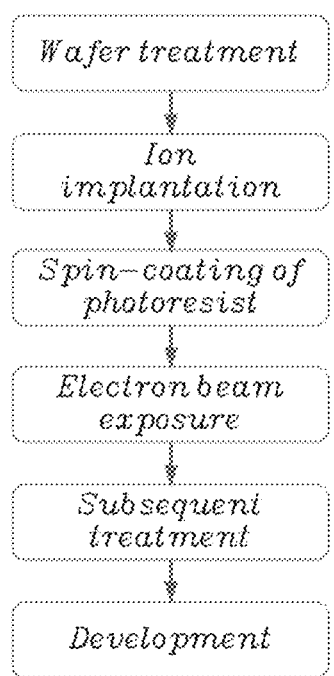
FIG. 1 is a flow chart of a method for building an etching-free hybrid nonlinear waveguide composed of a polymer and an ion-implanted nonlinear crystal in accordance with an embodiment of the present disclosure.

As illustrated in FIG. 1, the embodiment provides a method for building an etching-free hybrid nonlinear waveguide composed of a polymer and an ion-implanted nonlinear crystal. A nonlinear crystal is pretreated, and subjected to ion implantation to obtain an ion-implanted nonlinear crystal. The ion-implanted nonlinear crystal is spin-coated with a photoresist, and subjected to electron beam exposure, heating, and developing, so as to obtain the etching-free hybrid optical waveguide. The specific steps are as follows.

Step (1) Wafer Treatment

Firstly, a cut-formed and sheet-shaped nonlinear crystal (commonly used crystals such as lithium niobate, $KTiOPO_4$ (KTP), $LiB_3O_5$ (LBO), $\beta\text{-}BaB_2O_4$(BBO), etc., with a typical size of 10×10×2 $mm^3$) is subjected to surface polishing and cleaning to obtain a nonlinear wafer. The nonlinear wafer is stored in a storage device for use.

Step (2) Ion Implantation

Figure 3:
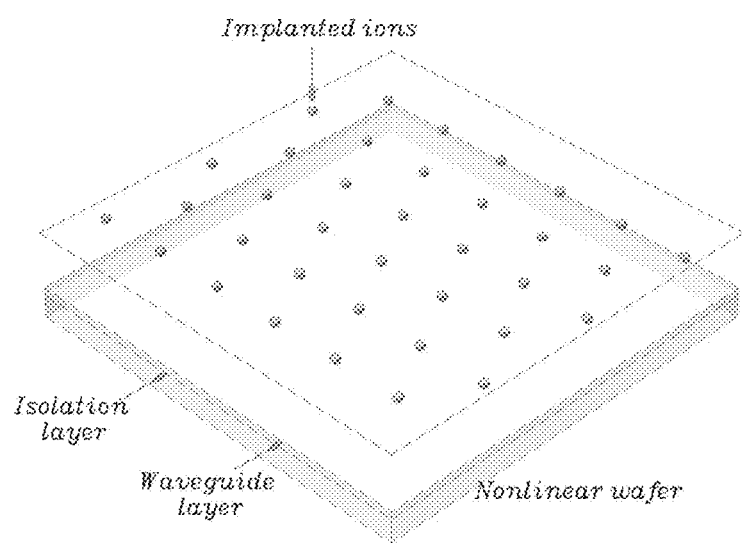
FIG. 3 schematically shows ion implantation of the wafer in accordance with Embodiment 1 of the present disclosure.

As illustrated in FIG. 3, an object of the step (2) is to form a layered waveguide with a thickness of a few microns, which allows a light transmitted in the waveguide to be confined in a vertical direction. The specific steps are as follows.

Ions (commonly used carbon and oxygen plasma) are accelerated by an ion accelerator. An acceleration energy of the ion accelerator is set to 5-15 MeV such that a surface of the nonlinear wafer in an injection chamber is bombarded.

The ions are ultimately kept a few microns below the surface of the nonlinear wafer, so as to form an isolation layer with a reduced refractive index, that is, the refractive index of the isolation layer is less than that of the waveguide layer, and is also less than that of the portion below the isolation layer (namely, the portion without being implanted with ions).

An incident distance of the ions directly determines a depth of the isolation layer and a thickness of the layered waveguide. The incident distance is controlled by the acceleration energy and has slight differences in different crystals.

Step (3) Spin-Coating of a Photoresist

Figure 4:
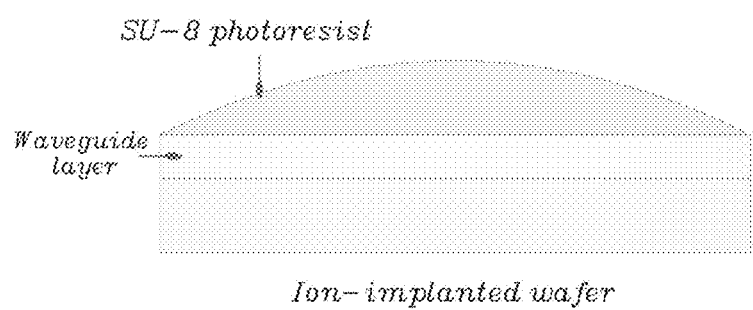
FIG. 4 is a side view of the wafer before spin coating in accordance with Embodiment 1 of the present disclosure.
Figure 5:
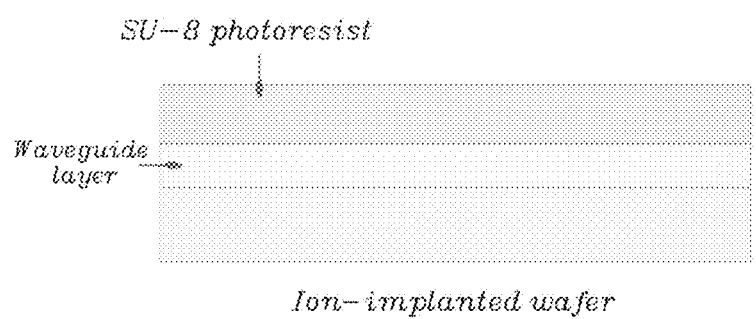
FIG. 5 is a side view of the wafer after spin-coated with a photoresist in accordance with Embodiment 1 of the present disclosure.

As illustrated in FIG. 4 and FIG. 5, a nonlinear wafer sample processed in the first two steps is placed in a heating furnace, heated at higher than 130° C. for more than 20 min to remove a moisture adsorbed in the sample, and then naturally cooled to room temperature.

An appropriate amount of SU-8 photoresist (an epoxy resin-based photoresist) is sucked by a dropper, and dropwise added onto a surface of the sample. The sample is transferred to a spin coater for spin coating. A rotation speed of the spin coater is set between 1040-3000 rpm, corresponding to different glue layer thicknesses (3-8 μm), so as to allow the spin coater to spin at a constant speed for 40 s.

It is worth noting that in order to prevent the photoresist from being thrown out and contaminating other portions of the spin coater, the rotation acceleration and the rotation deceleration need to be controlled within 100 rpm/s.

Step (4) Electron Beam Exposure

The sample is placed on a heating plate, heated at 120° C. for more than 2 min, and naturally cooled to room temperature to evaporate the remaining solvent in the photoresist and cure the photoresist.

Figure 2:
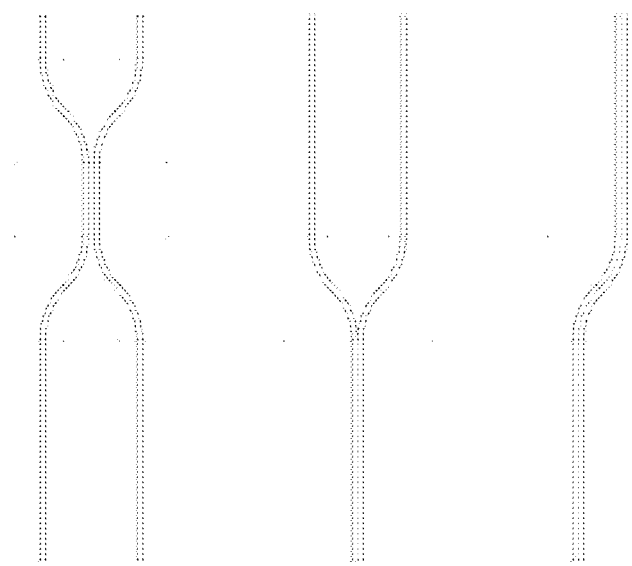
FIG. 2 is a schematic diagram of a two-dimensional pattern for electron beam exposure of a wafer in accordance with Embodiment 1 of the present disclosure.
Figure 6:
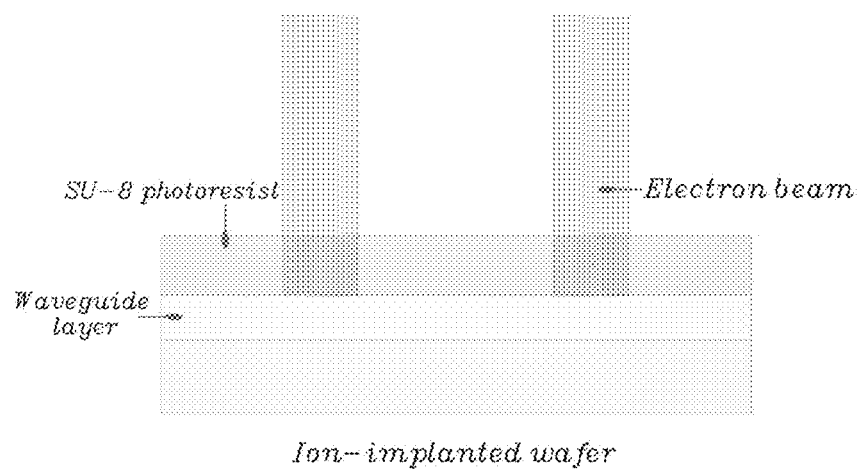
FIG. 6 is a side view of the wafer during the electron beam exposure in accordance with Embodiment 1 of the present disclosure.

As illustrated in FIG. 2 and FIG. 6, a two-dimensional pattern of an exposure area is drawn and introduced into an electron beam lithography system. A specific portion of the photoresist is subjected to irradiation by the electron beam lithography system based on the pattern, with an exposure dose of no less than 1400 mJ/cm². A chemical reaction in the photoresist is induced by the irradiation of the electron beam, which is, internal components are subjected to cross-linking and polymerization.

Step (5) Subsequent Treatment

Figure 7:
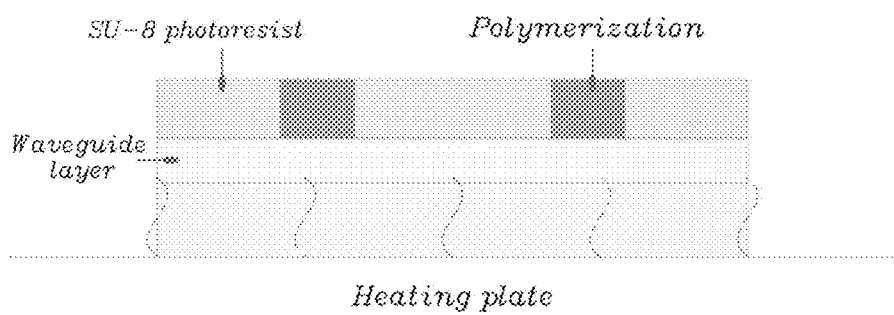
FIG. 7 is a side view of an exposed wafer under heating to accelerate polymerization in accordance with Embodiment 1 of the present disclosure.

As illustrated in FIG. 7, the sample is placed in the heating plate again, and subjected to heating at 95° C. for 5-10 min and cooling to room temperature. The polymerization of the photoresist is accelerated by the heating, which is, the cross-linking of the internal components. A polymer insoluble in a developing solution is formed ultimately. In order to control a reaction speed and improve a uniformity of the polymer, a heating rate and a cooling rate need to be controlled at 4° C./min.

Step (6) Development

Figure 8:
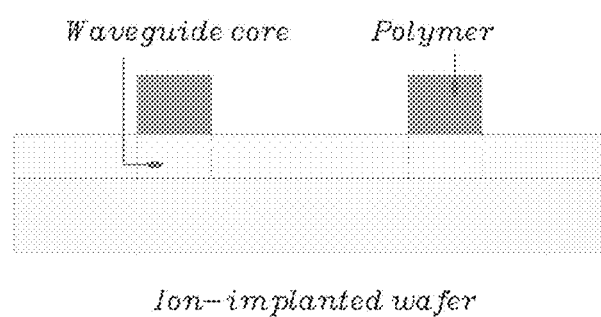
FIG. 8 is a side view of the wafer after developed in accordance with Embodiment 1 of the present disclosure.

As illustrated in FIG. 8, the sample is placed in a DRGM developer and soaked for 15-30 s to dissolve an unpolymerized photoresist and retain an exposed portion. The sample is continuously soaked for 1.5-3 s to make side walls of the polymer flatter and smoother. The sample is rinsed with isopropyl alcohol to remove a residual unpolymerized photoresist and developer, and dried with a flow of air or nitrogen, so as to obtain the etching-free hybrid optical waveguide.

It should be pointed out that, unlike nonlinear waveguides with ridged cross-sections formed by etching or machining, the method provided by the disclosure does not directly change a geometric shape of the nonlinear crystal to form two side walls, and confines a light beam inside the waveguide through total reflection at a crystal-air interface.

On the contrary, the method provided by the disclosure locally changes a dielectric environment around a crystal waveguide layer. The effect is that the crystal waveguide layer directly under the polymer exhibits a larger propagation constant ($\beta$) and effective refractive index ($n_{eff}$) than the crystal waveguide layer not covered by the polymer. This conclusion can be verified by solving the Helmholtz equation in the waveguide and surrounding medium.

When a light beam passes through the waveguide, the light beam will preferentially pass through a region with larger propagation constant and effective refractive index. Therefore, the presence of a polymer structure actually imposes a lateral constraint on the beam, thereby keeping the beam confined to a crystal layer directly beneath the polymer.

According to a consistency of the Helmholtz equation of wave optics and the Schrodinger equation of quantum mechanics, it can be seen that there must be a potential well directly below the polymer structure. When the light beam propagates in the waveguide, most of energy of the light beam will be confined in the potential well, forming a bound state.

Embodiment 2

Figure 9:
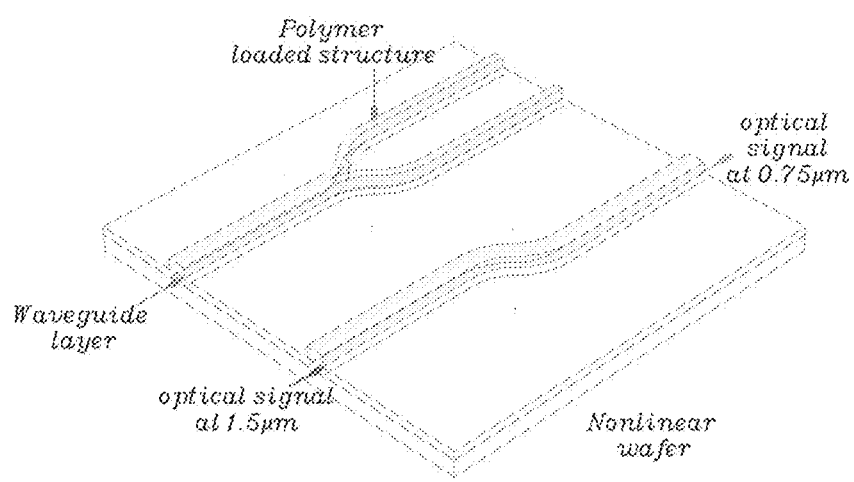
FIG. 9 shows nonlinear second harmonic generation of the waveguide in a 1.5 μm waveband in accordance with Embodiment 2 of the present disclosure.

As illustrated in FIG. 9, the embodiment provides a hybrid structure waveguide composed of linear and curved waveguides, which can nonlinearly convert a 1.5 μm wavelength optical signal into a 0.75 μm wavelength optical signal. The hybrid structure waveguide is constructed by the method provided in Embodiment 1, which not only shows the flexibility and practicality of the method, but also can derive a series of functional integrated optical devices such as waveguide beam splitters (which can divide a beam of light into two or more beams), and directional couplers (which can couple a beam from one waveguide to another waveguide) with simple changes on this basis, thereby having strong scalability.

Figure 10A:
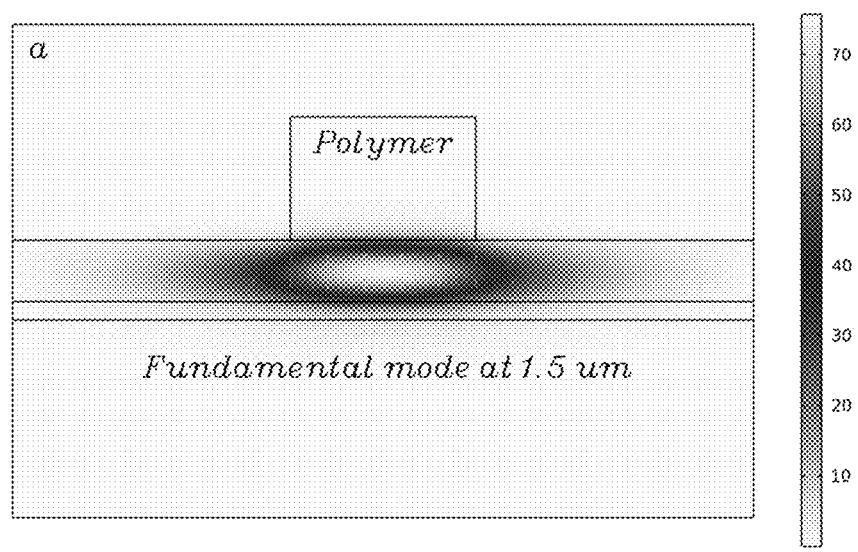
FIGS. 10A-B show transmission modes of a fundamental-mode light and a second harmonic-mode light in the waveguide in accordance with Embodiment 2 of the present disclosure; where (a): transmission mode of the fundamental-mode light at 1.5 μm waveband, and (b): the transmission mode of the second harmonic-mode light at 0.75 μm waveband.
Figure 10B:
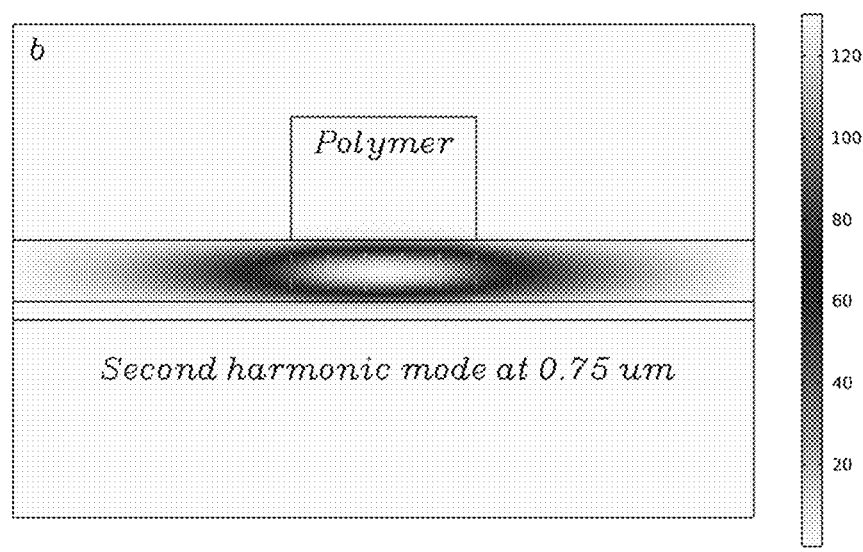

As illustrated in FIGS. 10A-B, a process of input, transmission, frequency conversion (from a first side port of the waveguide) and output (from a second side port of the waveguide) of the 1.5 μm optical signal is simulated. Transmission modes of a fundamental-mode light at 1.5 μm wavelength and a second harmonic-mode light at 0.75 μm wavelength in the waveguide are obtained.

In a first aspect, most of energy of both beams is confined within a core region of the waveguide. Although the crystal waveguide layer has no "hard boundary" in a horizontal direction, thanks to the presence of the polymer structure above the waveguide core and a physical mechanism of forming a bound state in the continuum (BIC), the waveguide also plays a good role in constraining the beam in the horizontal direction. This shows a feasibility of an underlying idea of the disclosure.

In a second aspect, an electric field of the light beam mainly vibrates in a vertical direction, as shown by the gray arrows in FIGS. 10A-B, and polarization directions of the fundamental frequency light and the second harmonic frequency light are basically the same. In order to avoid phase mismatch (destructive interference of frequency-doubled light) during a nonlinear frequency conversion process, the wafer in step (1) of Embodiment 1 needs to be subjected to periodic polarization in advance. Since periodic polarization technology has been commercialized, periodic polarization nonlinear wafers can be purchased directly and will not be described in detail here.

In a third aspect, the transmission modes of the fundamental frequency light and the second harmonic frequency light have a high degree of overlap. This shows that the energy of the fundamental frequency light can be directly coupled into a second harmonic transmission mode without complex mode conversion, which will bring higher nonlinear frequency conversion efficiency. In addition, from a perspective of integrated optical circuits, mode sizes of the fundamental frequency light at the input port and the frequency doubled light at the output port are basically the same, which means that optical circuit components of the same specifications can be used for a connection of both input and output ports, showing good integration.

Described above are merely preferred embodiments of the disclosure, and are not intended to limit the present disclosure. Without departing from the design spirit of the disclosure, various modifications and improvements made by those of ordinary skill in the art shall fall within the scope of the disclosure defined by the appended claims.

What is claimed is:

1. A method for building an etching-free hybrid nonlinear waveguide composed of a polymer and an ion-implanted nonlinear crystal, comprising:

(1) pretreating a nonlinear crystal to obtain a nonlinear wafer, and subjecting the nonlinear wafer to ion implantation to obtain an ion-implanted nonlinear wafer;

(2) spin-coating a photoresist on the ion-implanted nonlinear wafer followed by electron beam exposure and heating to obtain a polymer-coated nonlinear wafer; and (3) developing the polymer-coated nonlinear wafer to obtain the etching-free hybrid optical waveguide;

wherein the nonlinear crystal is pretreated through steps of:

subjecting the nonlinear crystal to cutting, surface polishing and cleaning to obtain the nonlinear wafer; and storing the nonlinear wafer in a storage device for use;

the ion implantation is performed by using an ion accelerator; and an acceleration energy of the ion accelerator is set to 5-15 MeV such that the nonlinear wafer is bombarded to form an isolation layer and a waveguide layer, wherein the waveguide layer has a thickness of several microns such that light is confined in a vertical direction when propagating in the waveguide layer, and a refractive index of the isolation layer is less than that of the waveguide layer, and is also less than that of a portion of the ion-implanted nonlinear wafer below the isolation layer;

the step of spin-coating the photoresist on the ion-implanted nonlinear wafer comprises:

heating the ion-implanted nonlinear wafer in a heating furnace at 130° C.or more for at least 20 min to remove moisture in the ion-implanted nonlinear wafer, and naturally cooling the ion-implanted nonlinear wafer to room temperature;

dropwise adding the photoresist onto a surface of the ion-implanted nonlinear wafer, and transferring the ion-implanted nonlinear wafer to a spin coater followed by spin coating at 1,040-3,000 rpm for 40 seconds to obtain a photoresist-coated nonlinear wafer; wherein a photoresist layer of the photoresist-coated nonlinear wafer has a thickness of 3-8 μm, and a rotation acceleration and a rotation deceleration of the spin coater are controlled to be equal to or less than 100 rpm/s to prevent the photoresist from being thrown out and contaminating the spin coater; and the photoresist is an epoxy resin-based photoresist;

the electron beam exposure is performed through steps of:

heating the photoresist-coated nonlinear wafer at 120° C.on a heating plate for 2 min or more followed by natural cooling to room temperature to evaporate remaining solvent in the photoresist layer and cure the photoresist layer; and drawing a two-dimensional pattern of an exposure area and introducing the two- dimensional pattern into an electron beam lithography system, and irradiating the photoresist within the exposure area based on the two-dimensional pattern to induce cross linking and polymerization in the photoresist, so as to obtain an exposed nonlinear wafer, wherein an exposure dose of the electron beam exposure is 1400 mJ/cm$^2$ or more;

in step (2), the heating is performed through steps of:

heating the exposed nonlinear wafer at 95° C. on the heating plate for 5-10 min to accelerate the cross linking and polymerization of the photoresist within the exposure area, followed by cooling to room temperature to form a polymer insoluble in a developing solution, so as to obtain the polymer-coated nonlinear wafer; wherein a heating rate and a cooling rate are controlled to 4° C/min to control polymerization rate and improve polymerization uniformity; and the step of developing the polymer-coated nonlinear wafer comprises:

soaking the polymer-coated nonlinear wafer in-a the developing solution for 15-30 seconds to remove unpolymerized photoresist, and soaking the polymer-coated nonlinear wafer in another developing solution for 1.5-3 seconds to make a side wall of the polymer uniform and smooth; and rinsing the polymer-coated nonlinear wafer with isopropyl alcohol to remove residual unpolymerized photoresist and residual developing solution, followed by drying in an air or nitrogen flow to obtain the etching- free hybrid optical waveguide.

* * * * *